(12) United States Patent
Mori

(10) Patent No.: US 8,289,721 B2
(45) Date of Patent: Oct. 16, 2012

(54) ELECTRONIC UNIT AND ELECTRONIC APPARATUS

(75) Inventor: Takeshi Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 341 days.

(21) Appl. No.: 12/396,733

(22) Filed: Mar. 3, 2009

(65) Prior Publication Data

US 2009/0225522 A1   Sep. 10, 2009

(30) Foreign Application Priority Data

Mar. 7, 2008   (JP) .................. 2008-057935

(51) Int. Cl.
H05K 5/00 (2006.01)
H05K 3/30 (2006.01)
H05K 7/12 (2006.01)

(52) U.S. Cl. .................. 361/752; 174/138 G (58) Field of Classification Search .......... 361/807, 361/810; 174/138 E, 138 G
See application file for complete search history.

(56) References Cited

U.S. PATENT DOCUMENTS

| | | | | |
|---|---|---|---|---|
| 4,771,365 A * | 9/1988 | Cichocki et al. | ............ | 361/705 |
| 5,371,654 A * | 12/1994 | Beaman et al. | ............ | 361/744 |
| 5,655,143 A * | 8/1997 | Alpert et al. | ............ | 361/600 |
| 5,841,628 A * | 11/1998 | Alpert et al. | ............ | 361/600 |
| 5,973,923 A * | 10/1999 | Jitaru | ............ | 361/704 |
| 6,137,164 A * | 10/2000 | Yew et al. | ............ | 257/686 |
| 6,198,222 B1 * | 3/2001 | Chang | ............ | 313/582 |
| 6,304,450 B1 * | 10/2001 | Dibene et al. | ............ | 361/704 |
| 6,333,459 B1 * | 12/2001 | Sato et al. | ............ | 174/377 |
| 6,414,849 B1 * | 7/2002 | Chiu | ............ | 361/760 |
| 6,434,008 B1 * | 8/2002 | Yamada et al. | ............ | 361/728 |
| 6,532,152 B1 * | 3/2003 | White et al. | ............ | 361/692 |
| 6,697,261 B2 * | 2/2004 | Matsuda | ............ | 361/767 |
| 6,770,813 B1 * | 8/2004 | Ramsagar et al. | ............ | 174/525 |
| 6,771,509 B2 * | 8/2004 | Wakabayashi et al. | ............ | 361/719 |
| 6,909,176 B1 * | 6/2005 | Wang et al. | ............ | 257/706 |
| 7,034,387 B2 * | 4/2006 | Karnezos | ............ | 257/686 |
| 7,184,276 B2 * | 2/2007 | Hashimoto | ............ | 361/803 |
| 2004/0246682 A1 * | 12/2004 | Osakada et al. | ............ | 361/709 |
| 2006/0061979 A1 * | 3/2006 | Elliott et al. | ............ | 361/807 |
| 2008/0186662 A1 * | 8/2008 | Lee | ............ | 361/681 |

FOREIGN PATENT DOCUMENTS

JP     2006-120378 A     5/2006

* cited by examiner

*Primary Examiner* — Lisa Lea Edmonds
*Assistant Examiner* — Xanthia C Cunningham
(74) *Attorney, Agent, or Firm* — Hamre, Schumann, Mueller & Larson, P.C.

(57) ABSTRACT

An electronic unit according to the present invention, the first support member has a first base body, and a first contact member extending from the first base body and making contact with the first main surface of the substrate. The second support member includes a second base body, and a second contact member extending from the second base body and making contact with the second main surface of the substrate. At least part of the area on the first main surface that corresponds to the region at which the second contact member is in contact with the substrate overlaps with the region at which the first contact member is in contact with the substrate. This electronic unit is capable of suppressing distortion in the substrate even when an impact is applied from the exterior. The electrical connection between the electronic component and the substrate can therefore be prevented from being disrupted.

7 Claims, 8 Drawing Sheets

ELECTRONIC UNIT AND ELECTRONIC APPARATUS

BACKGROUND OF THE INVENTION

1. Field of the Invention

The present invention relates to an electronic unit and electronic apparatus provided with a substrate that includes electronic components, and particularly relates to an electronic unit and electronic apparatus in which it is difficult to disrupt the electric connections between wires and electronic components mounted on the substrate even under the application of an external force.

2. Description of Related Art

Electronic apparatuses such as computers, television receivers, and recording/reproducing apparatuses that record to and play back from disks and the like are provided with substrates on which electronic components are mounted. As an example of such an electronic apparatus, JP 2006-120378A (referred to as "Patent Document 1" hereinafter) discloses the configuration of an intercom provided with a substrate on which electronic components are mounted.

Figure 7:
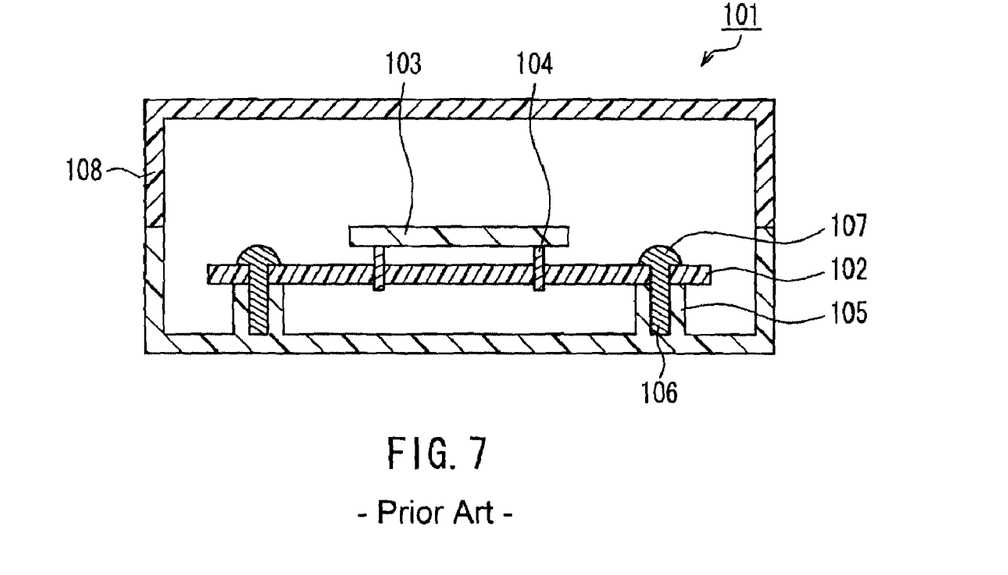
FIG. 7 is a cross-sectional view of a conventional electronic apparatus.

FIG. 7 illustrates a cross-sectional view of this conventional electronic apparatus. As shown in FIG. 7, an intercom 101, which is an example of an electronic apparatus, includes an outer housing 108 that encloses the apparatus. A substrate 102, on which an electronic component 103 is mounted, is contained within the housing 108. Terminals 104 of the electronic component 103 are electrically connected to the wiring (not shown) of the substrate 102. Bosses 105 are formed in the housing 108, and the substrate 102 is anchored to the housing 108 by threading screws 107 through the substrate 102 and into the bosses 105.

In recent years, weight reduction and miniaturization have been progressing in electronic devices, and the portability thereof is improving, as exemplified by laptop computers, mobile telephone terminals, portable game devices, and so on. Electronic devices that feature such portability are more likely to, for example, be dropped on the floor, collide with other objects, and so on, and thus it is necessary to shock-proof such devices.

Figure 8:
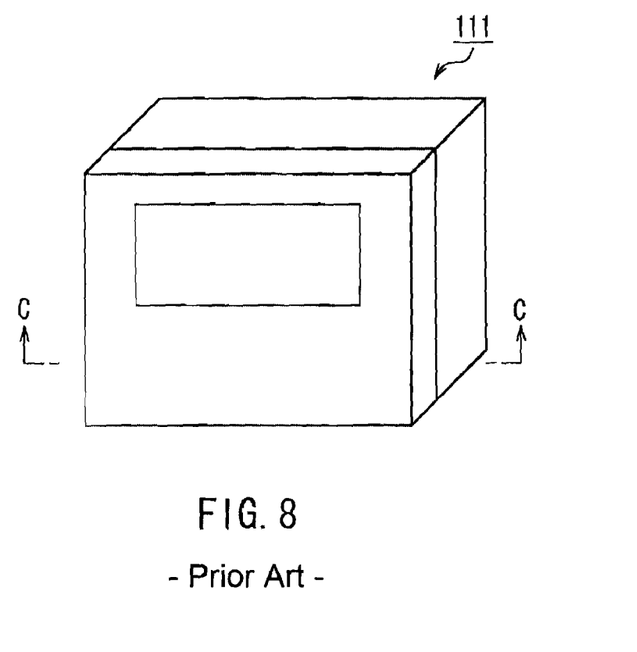
FIG. 8 is a perspective view of a conventional electronic apparatus.
Figure 9:
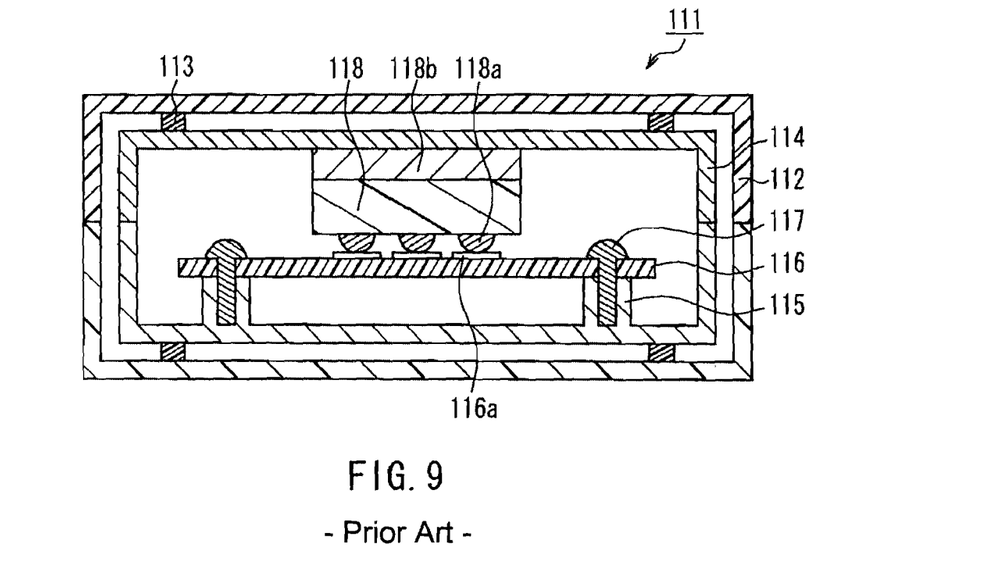
FIG. 9 is a cross-sectional view taken along the C-C line shown in FIG. 8.

FIG. 8 illustrates a perspective view of a conventional electronic apparatus 111 that has been shock-proofed. FIG. 9 illustrates a cross-sectional view taken along the C-C line shown in FIG. 8. FIG. 9 is a cross-sectional view of a substrate 116 that has been cut vertically relative to its main surface.

As shown in FIG. 9, a housing 112 contains an intermediate chassis 114. The intermediate chassis 114 is anchored to the housing 112 via support portions 113. The intermediate chassis 114 is formed of metal, and bosses 115 are formed on the inner surface of the intermediate chassis 114. The substrate 116 is anchored to the bosses 115 with screws 117. An electronic component 118 is mounted on the substrate 116. Terminals 118a of the electronic component are connected to a wiring pattern 116a provided on the surface of the substrate 116. Recently, taking into consideration high-density mounting and space conservation, components packaged as ball grid arrays (BGAs) are used as the electronic component 118. Furthermore, the rear surface of the mounting surface of the electronic component 118 is in contact with the intermediate chassis 114 via a buffer member 118b formed of a material that has a high degree of thermal conductivity, such as graphite.

According to the electronic apparatus shown in FIG. 9, heat generated by the electronic component 118 can be dissipated to the intermediate chassis 114 via the buffer member 118b formed of a material that has a high degree of thermal conductivity, thereby improving the efficiency of heat dissipation of the electronic component 118. Furthermore, electromagnetic waves emitted by the electronic component 118 are absorbed by the intermediate chassis 114, making it possible to reduce electromagnetic waves leaking to the exterior of the electronic apparatus.

Figure 10:
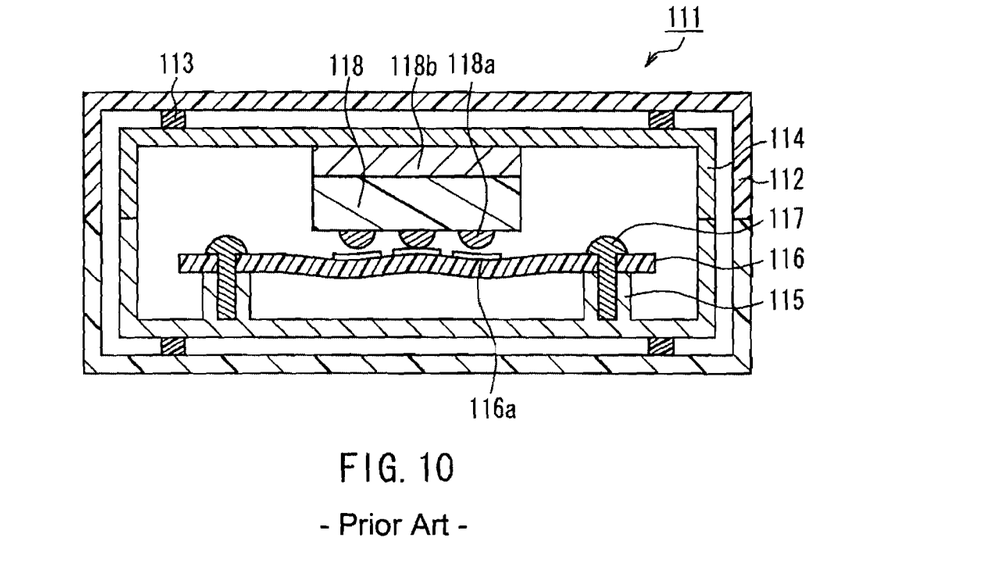
FIG. 10 is a cross-sectional view of an electronic apparatus in a state in which the apparatus has been impacted from the exterior.

If an impact is applied to such a conventional electronic apparatus, such as when the apparatus is dropped accidentally, the impact on the housing 112 will pass through the support portion 113 and the intermediate chassis 114 to the substrate 116. Because both ends of the substrate 116 are anchored to the bosses 115 using the screws 117, when a force such as an impact is applied, the substrate 116 experiences a wave and distorts, as shown in FIG. 10. When the substrate 116 distorts, there is a high probability that the terminals 118a of the electronic component 118 mounted upon the substrate 116 will separate from the wiring pattern 116a formed on the surface of the substrate 116, disrupting the electrical connection. Although such separation of terminals from the wiring pattern occurs more prominently in electronic components packaged as BGAs, there is also the chance for such a disconnection to occur in electronic components whose terminals are connected using connection wiring provided by QFPs (Quad Flat Packages).

SUMMARY OF THE INVENTION

Therefore, with the foregoing in mind, it is an object of the present invention to provide an electronic unit and electronic apparatus capable of preventing a substrate from distorting and disrupting connections even if a drop impact or the like is applied to the electronic apparatus.

The electronic unit of the present invention comprises a substrate including a first main surface and a second main surface opposite to the first main surface, on which an electronic component is mounted, and a support member that supports the substrate. The support member includes a first support member and a second support member, with the substrate being sandwiched between the support members. The first support member includes a first base body, and a first contact member capable of being in contact with the first main surface. The second support member includes a second base body, and a second contact member capable of being in contact with the second main surface; and at least part of the area on the substrate at which the first contact member is in contact with the substrate overlaps with a region at which the second contact member is in contact with the substrate.

The electronic apparatus of the present invention comprises a housing and an electronic unit that includes a substrate having a first main surface on which an electronic component is mounted and a second main surface opposite to the first main surface, and a support member that supports the substrate. The electronic unit is contained in the housing, and the support member includes a first support member and a second support member, with the substrate being sandwiched between the support members; the first support member includes a first base body, and a first contact member capable of being in contact with the first main surface. The second support member includes a second base body, and a second contact member capable of being in contact with the second main surface; and at least part of the area on the substrate at which the first contact member is in contact with the substrate overlaps with a region at which the second contact member is in contact with the substrate.

According to the present invention, an electronic unit and electronic apparatus capable of preventing a substrate from distorting and severing connections even if a drop impact or the like is applied to the electronic apparatus can be provided by supporting the substrate with a first contact member and a second contact member.

DETAILED DESCRIPTION OF THE INVENTION

Hereinafter, the present invention will be described by way of illustrative embodiments with reference to the drawings.

The electronic unit of the present invention comprises a substrate including a first main surface and a second main surface opposite to the first main surface, on which an electronic component is mounted, and a support member that supports the substrate. The support member includes a first support member and a second support member, with the substrate being sandwiched between the support members. The first support member includes a first base body, and a first contact member capable of being in contact with the first main surface. The second support member includes a second base body, and a second contact member capable of being in contact with the second main surface; and at least part of the area on the substrate at which the first contact member is in contact with the substrate overlaps with a region at which the second contact member is in contact with the substrate.

The electronic unit of the present invention can take on various forms using the aforementioned configuration as a base.

In other words, the configuration of the electronic unit of the present invention can be such that either the first contact member and the first base body, the second contact member and the second base body, or both sets of contact members and base bodies are formed as a single body. With such a configuration, it is possible simultaneously to manufacture the first contact member and first base body and/or the second contact member and second base body, making it possible to eliminate a process for anchoring the contact members to their respective base bodies. Furthermore, the resistance to impact, due to disturbances, that shakes the substrate in the surface direction can be improved.

The configuration of the electronic unit of the present invention can be such that the first contact member and the second contact member are capable of making contact with the substrate at the region that experiences the largest amount of distortion. Through such a configuration, it is possible to suppress the overall substrate from distorting when an impact is applied to the electronic unit. Accordingly, it is possible to prevent breakage, such as cracks, from occurring in parts of the substrate, in the vicinity of the portions of the substrate anchored to the support members, the outer edges of the corners of the substrate, and so on.

The configuration of the electronic unit of the present invention can be such that the center line of the first contact member and the center line of the second contact member are matched, and the center lines are center on the surface of the contact members that is in contact with the substrate. Through such a configuration, it is possible to suppress the overall substrate from distorting when an impact is applied to the electronic unit. In addition, the first contact member and second contact member can be brought into contact with the substrate at right angles. Accordingly, it is possible to prevent breakage, such as cracks, from occurring in the vicinity of the portions of the substrate anchored to the support members. It is also possible to cause, for example, a rotation moment in the substrate, thereby suppressing the burden placed on the substrate.

The configuration of the electronic unit of the present invention can be such that the first contact member and the second contact member are capable of making contact with the substrate in the vicinity of the electronic component. By employing such a configuration, it is possible to suppress impacts on the substrate arising due to disturbances applied to the electronic unit, thereby making it possible to prevent the soldered connections between the substrate and the electronic component from separating.

The configuration of the electronic unit of the present invention can be such that the first contact member and the second contact member are plate-shaped. By employing such a configuration, the rigidity of the first base body and the second base body can be improved.

Embodiment 1

1. Configuration of Electronic Apparatus

Figure 1:
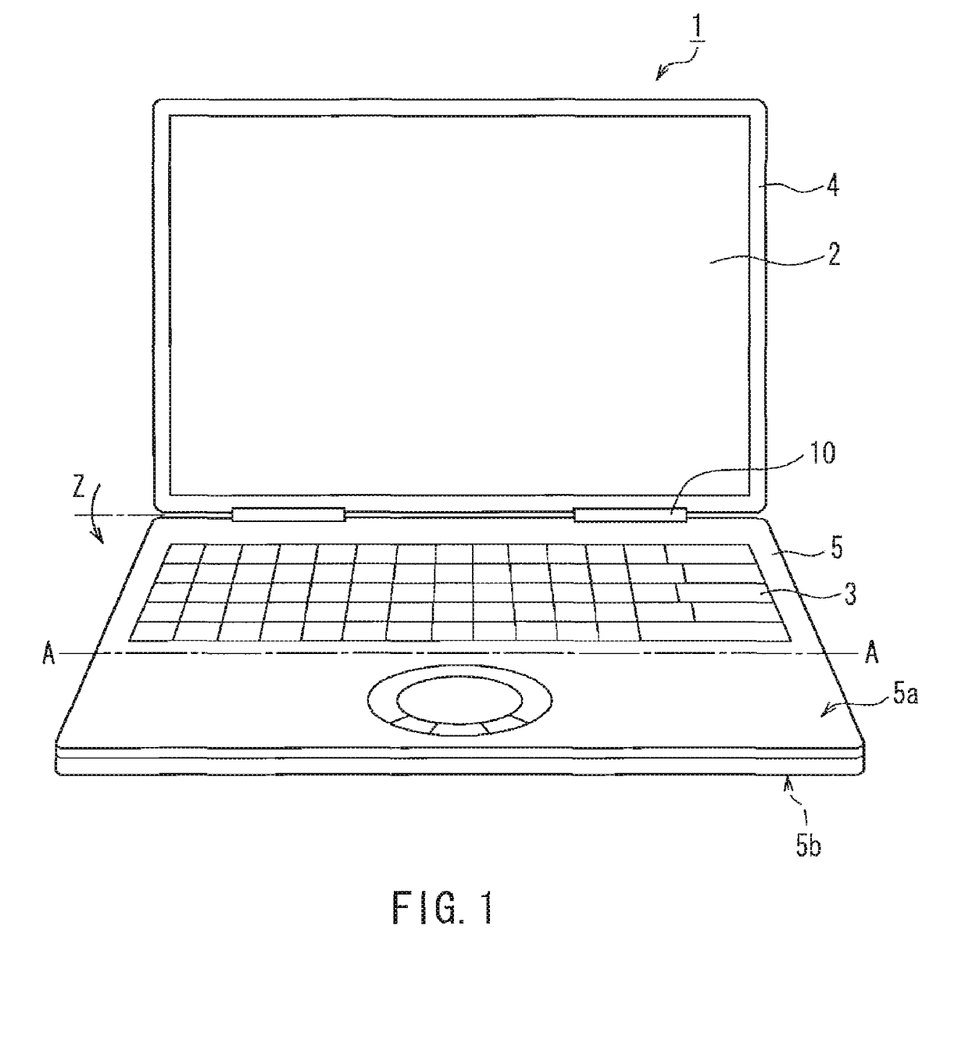
FIG. 1 is a perspective view of an electronic apparatus according to Embodiment 1 of the present invention.

FIG. 1 is a perspective view of an electronic apparatus 1 according to Embodiment 1 of the present invention. The electronic apparatus 1 is an apparatus provided with a substrate on which electronic components are mounted, such as a personal computer, a terminal apparatus for an inventory management system, a mobile telephone terminal, or the like. In the present embodiment, a laptop computer shall be described as an example of the electronic apparatus 1.

The electronic apparatus 1 includes a first housing 4 and a second housing 5. The first housing 4 provides a display monitor 2. The second housing 5, meanwhile, includes an operational unit 3. The first housing 4 and the second housing 5 are connected by a hinge mechanism configured of hinge portions 10, enabling the two housings to pivot in the direction of or opposite to the arrow Z. The display monitor 2 can be implemented by, for example, a liquid-crystal display. The operational unit 3 accepts input operations made by a user. The operational unit 3 can be implemented using a keyboard, a touch panel, or the like.

Note that a state in which the first housing 4 of the electronic apparatus 1 has been rotated so that the display monitor 2 and the operational unit 5 are exposed, as shown in FIG. 1, is defined as an "open state". Likewise, a state in which the first housing 4 has been rotated in the direction of the arrow Z from the state shown in FIG. 1, thereby placing the display monitor 2 and the operational unit 3 opposite to each other, is defined as a "closed state". The direction of the second housing 5 when the electronic apparatus 1 is in the closed state and the second housing 5 is opposite to the first housing 4 is defined as "up". The direction opposite to "up" with respect to the second housing 5 therefore is defined as "down".

Figure 2:
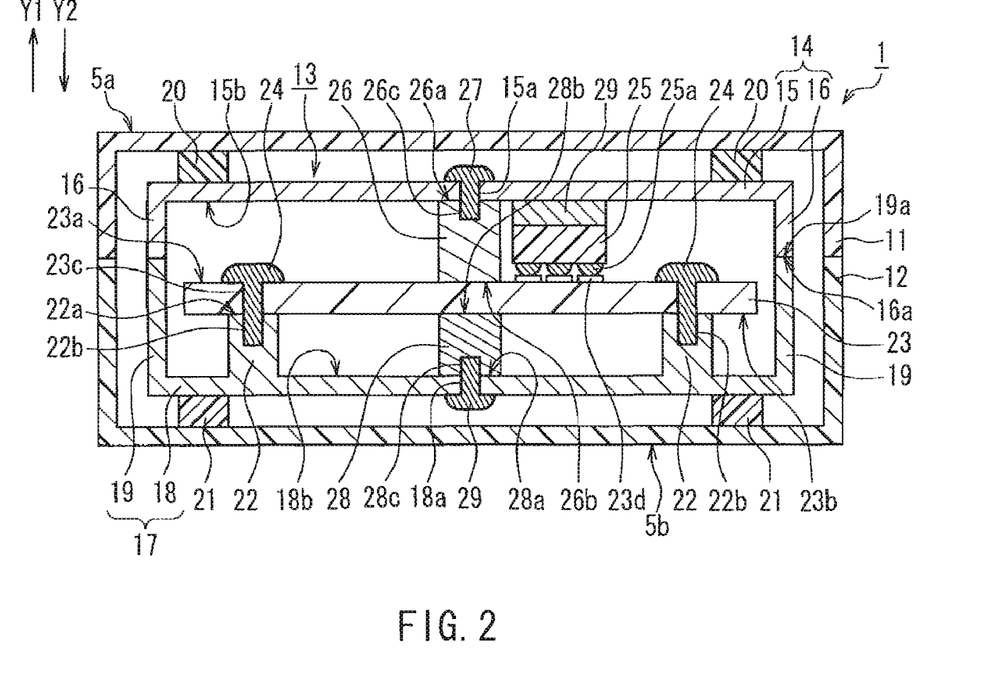
FIG. 2 is a cross-sectional view taken along the A-A line shown in FIG. 1.

FIG. 2 is a cross-sectional view taken along the A-A line shown in FIG. 1. Note that in FIG. 2, elements unnecessary in the descriptions of the present embodiment have been omitted.

An electronic unit 13 is enclosed within an upper surface housing 11 and a lower surface housing 12, which together make up the second housing 5. The electronic unit 13 includes an upper chassis 14 and a lower chassis 17. The upper chassis 14 and the lower chassis 17 are connected to each other, and within the inner space formed by the two chassis being connected, a substrate 23 is provided.

The upper chassis 14 includes an upper primary wall 15 and upper side walls 16. Buffer members 20 are anchored between the upper primary wall 15 and the upper surface housing 11. The buffer members 20 may be formed of an elastic material such as rubber.

The lower chassis 17 includes a lower primary wall 18 and lower side walls 19. Buffer members 21 are anchored between the lower primary wall 18 and the lower surface housing 12. The buffer members 21 may be also formed of an elastic material such as rubber. End portions 19a of the lower side walls 19 are in contact with end portions 16a of the upper side walls 16.

Bosses 22 are formed in the inner surface of the lower primary wall 18 (that is, the surface opposite to the upper primary wall 15) as a single body. End portions 22a of the bosses 22 are end portions that are in contact with the substrate 23. A screw hole 22b is formed in each end portion 22a. Through-holes 23c, through which screws 24 can pass, are formed in the substrate 23. The screws 24 are passed through the through-holes 23c from the side of the upper surface 23a of the substrate 23, and are threaded into the screw holes 22b, thereby anchoring the substrate 23 to the bosses 22. This makes it possible to anchor the substrate 23 to the lower chassis 17.

A wiring pattern 23d is provided in the upper surface 23a of the substrate 23. Terminals 25a of an electronic component 25 may be electrically connected to the wiring pattern 23d of the substrate 23 with solder.

A through-hole 15a is formed in the upper primary wall 15. The inner surface 15b of the upper primary wall 15 (the surface opposite to the lower primary wall 18) is in contact with an upper column member 26 (contact member) via an end portion 26a. The end portion 26a of the upper column member 26 is the end portion on the side of the upper column member 26 that is in contact with the upper primary wall 15. Meanwhile, the other end portion of the upper column member 26, or an end portion 26b opposite to the end portion 26a, is in contact with the upper surface 23a of the substrate 23, or is opposite the upper surface 23a of the substrate 23 with an extremely small amount of space provided therebetween. A screw hole 26c is formed in the end portion 26a. A screw 27 is threaded through the through-hole 15a and into the screw hole 26c, thereby anchoring the upper column member 26 to the upper primary wall 15.

A through-hole 18a is formed in the lower primary wall 18. The inner surface 18b of the lower primary wall 18 (the surface opposite to the upper primary wall 15) is in contact with a lower column member 28 (contact member) via an end portion 28a. The end portion 28a of the lower column member 28 is the end portion on the side of the lower column member 28 that is in contact with the lower primary wall 18. Meanwhile, the other end portion of the lower column member 28, or an end portion 28b, is in contact with the lower surface 23b of the substrate 23, or is opposite the lower surface 23b of the substrate 23 with an extremely small amount of space provided therebetween. A screw hole 28c is formed in the end portion 28a. A screw 29 is threaded through the through-hole 18a and into the screw hole 28c, thereby anchoring the lower column member 28 to the lower primary wall 18.

Although the end portion 26b of the upper column member 26 and the upper surface 23a of the substrate 23 may be in tight contact or are opposite each other with an extremely small amount of space provided therebetween, it should be noted that the present embodiment describes an example in which the two are in tight contact. Likewise, although the end portion 28b of the lower column member 28 and the lower surface 23b of the substrate 23 may be in tight contact or are opposite each other with an extremely small amount of space provided therebetween, it should be noted that the present embodiment describes an example in which the two are in tight contact. In the following descriptions, the term "contact" is intended to be taken as meaning "tight contact" unless otherwise specified. Note that an "extremely small amount of space" refers to a distance less than or equal to the amplitude of the distortion that is transmitted to the substrate 23 caused by the electronic unit 13 receiving a disturbance. This amplitude can be evaluated based on, for example, the surface area of the substrate 23, the mounting state of electronic component 25 with respect to the substrate 23 (that is, the mounting density, size, mass, and so on of the electronic components 25), the positioning in the substrate 23 of the screws 24 that anchor the substrate 23 to the lower chassis 17, and so on. The distance of this extremely small amount of space therefore cannot be specified.

At least part of the area on the lower surface 23b of the substrate 23 that corresponds to the region at which the end portion 26b is in contact with the upper surface 23a of the substrate 23 overlaps with the region at which the end portion 28b is in contact with the lower surface 23b of the substrate 23. In other words, the substrate 23 is supported on both the top and bottom by the upper column member 26 and the lower column member 28, respectively.

Figure 3A:
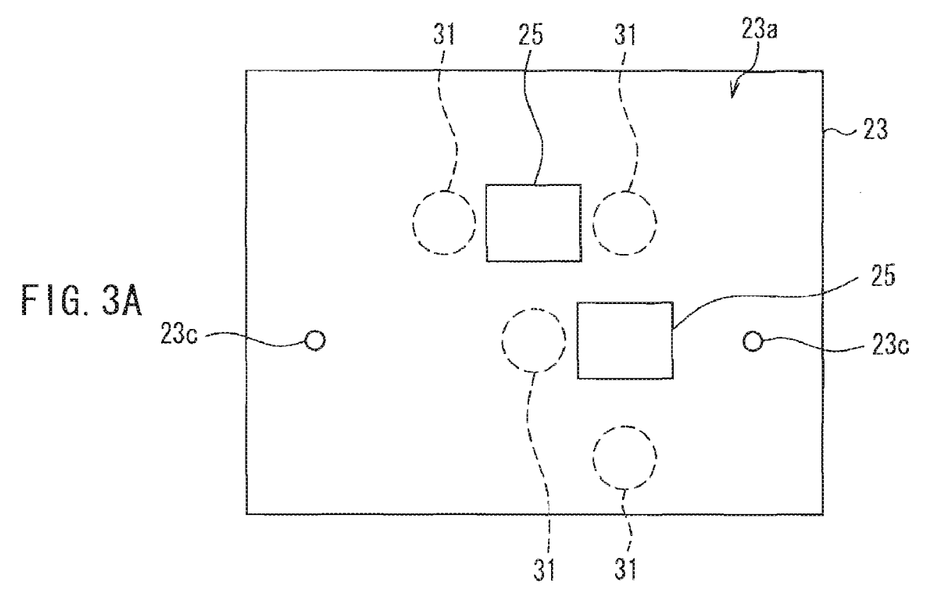
FIG. 3A is a plan view of a substrate.

FIG. 3A is a plan view of the upper surface 23a of the substrate 23. Contact regions 31 represent regions in which upper column members 26 is in contact with the upper surface 23a of the substrate 23. It is preferable for the contact regions 31 to be present in the regions of the substrate 23 that distort the most when an impact is applied to the electronic apparatus 1. For example, in the case where the vicinity of the external edge of the substrate 23 is anchored and supported by screws and/or in the case where electronic components 25 are mounted almost uniformly across the entire surface of the substrate 23, the vicinity of the center of the substrate 23 distorts the most; positioning a contact region 31 in the vicinity of the center of the substrate 23 therefore makes it possible to reduce distortion of the substrate 23. It is thus possible to prevent cracks from forming in the substrate 23 in the vicinity of the through-holes 23c.

In the substrate 23 shown in FIG. 3A, the electronic components 25 are disposed in the vicinity of the center of the substrate 23, and thus it is preferable for the contact regions 31 to be surrounding or in the vicinity of the electronic components 25. Positioning the contact regions 31 surrounding or in the vicinity of the electronic components 25 makes it possible to prevent the soldered portions of the electronic components 25 from separating due to distortion of the substrate 23.

Note that a configuration in which the upper column member 26 is in contact with the top of an electronic component 25 mounted on the substrate 23 also can prevent the soldered portions of the electronic component 25 that the upper column member 26 is in contact with from separating. However, distortion in the substrate 23 is transmitted directly to the electronic component 25. There is a high likelihood that the electronic component 25 will be damaged, and thus the configuration in which the electronic component 25 is in contact with the upper column member 26 offers no practical advantages.

2. Behavior When Impact is Applied to Electronic Apparatus

Next, states occurring when an impact, such as an impact resulting from being dropped, is applied to the electronic apparatus 1 having the abovementioned configuration shall be described with reference to FIGS. 2 and 3A.

When a user accidentally drops the electronic apparatus 1 onto to floor or the like, a large impact is applied to the electronic apparatus 1 when the electronic apparatus 1 collides with the floor or the like. For example, when an impact is applied to the lower surface housing 12 (see FIG. 2), that impact is transmitted to the electronic unit 13 via the buffer member 21. Because the buffer member 21 is formed of an elastic body, the impact transmitted from the lower surface housing 12 can be softened. Meanwhile, in the case where an impact is applied to the upper surface housing 11, that impact is softened by the buffer member 20 before being transmitted to the electronic unit 13.

The impact that is transmitted to the electronic unit 13 attempts to reach the substrate 23 via the upper column member 26 or the lower column member 28.

Here, because the upper column member 26 and the lower column member 28 are formed in a column shape, the durability with respect to the directions indicated by the arrows Y1 and Y2 in FIG. 2 is high. For this reason, even if an impact is transmitted from the upper surface housing 11 and the lower surface housing 12, the upper column member 26 and the lower column member 28 experience very little distortion in the directions indicated by the arrow Y1 or Y2 shown in FIG. 2. Therefore, the substrate 23 is supported from the top and the bottom by the upper column member 26 and the lower column member 28, and as a result, regions supported by the upper column member 26 and the lower column member 28 experience almost no distortion. In addition, because the region of the substrate 23 that experiences the most distortion is supported by the upper column member 26 and the lower column member 28, the substrate experiences little distortion as a whole.

Therefore, as shown in FIG. 3A, disposing the electronic components 25 in the vicinity of the contact regions 31 makes it possible to prevent the terminals 25a of the electronic component 25 from separating from the wiring pattern 23d (see FIG. 2), thereby preventing disruption of the electrical connection between the terminals 25a and the wiring pattern 23d. This effect is particularly evident in BGA-packaged electronic components, whose adhesion to the substrate 23 is relatively weak.

3. Effects of the Embodiment, etc.

According to the present embodiment, the substrate 23 can be prevented from being damaged when an impact is applied to the electronic apparatus 1. In other words, with a configuration such as that shown in FIG. 7, in which the region of the substrate 102 that distorts the most (for example, the vicinity of the center) is not supported, the substrate 102 distorts extensively when an impact is applied to the electronic apparatus 101. If the substrate 102 distorts extensively, there is a heightened chance for damage such as cracking to occur in the vicinity of the portions that are anchored by the screws 107. As opposed to this, in the configuration of the present embodiment, the regions of the substrate 23 that experience the most distortion are supported by the upper column member 26 and the lower column member 28, making it possible to reduce the amount by which the substrate 23 distorts when an impact is applied to the electronic apparatus 1. It is therefore possible to prevent damage such as cracks from occurring in the portions of the substrate 23 that are anchored to the lower chassis 17 (the vicinity of the through-holes 23c).

Note that the "regions that distort the most" in the substrate 23 generally indicates the regions that are the furthest (in FIG. 3A, a line central and perpendicular to a line spanning between the two through-holes 23c) from the portions of the substrate 23 that are anchored (in FIG. 3A, the through-holes 23c). However, as mentioned earlier, the "regions that distort the most" change depending on the state in which the electronic components 25 are mounted on the substrate 23. Practically speaking, the "region that distorts the most" tends to be in the vicinity of the center of the substrate 23.

In addition, with the electronic apparatus 1 according to the present embodiment, the top and bottom of the substrate 23 are supported by the upper column member 26 and the lower column member 28, respectively, thereby reducing the amount of distortion of the substrate 23, and making it possible to prevent disruption of the electrical connection between the terminals 25a of the electronic component 25 and the wiring pattern 23d of the substrate 23.

Figure 3B:
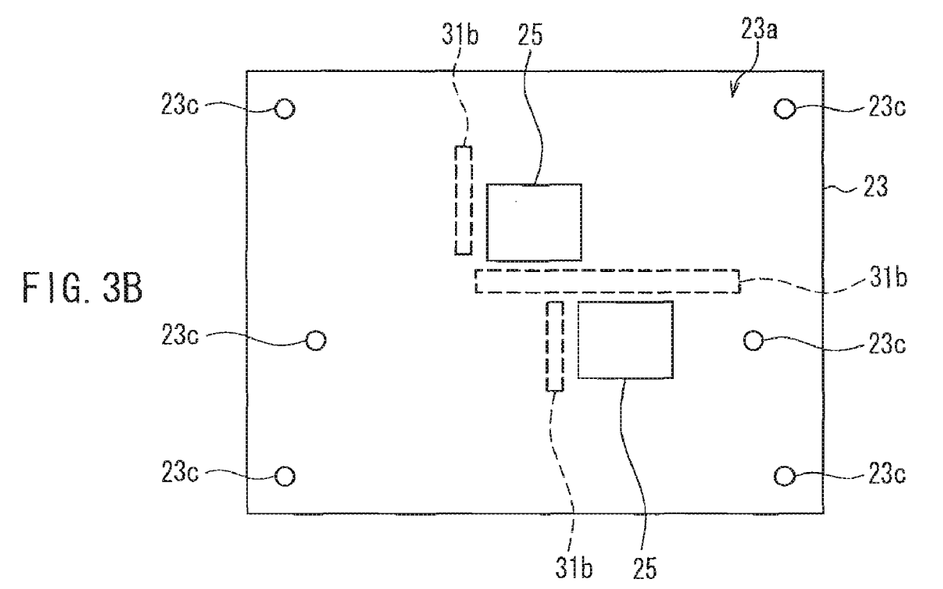
FIG. 3B is a plan view illustrating another configuration of a substrate.

Although the shape of the contact members that support the substrate 23 are described as being columns (column members) in the present embodiment, it should be noted that the contact members may instead be plate-shaped (plate members). FIG. 3B is a plan view illustrating a substrate 23 provided with plate-shaped contact members (called "plate members" hereinafter). As shown in FIG. 3B, plate contact regions 31b, with which the plate members is in contact, are present in the substrate 23 in the vicinity of the electronic components 25, or regions where the substrate 23 distorts the most when an impact is applied to the electronic apparatus 1. Because the plate contact regions 31b have an area that is larger than that of the contact regions 31 with which the column members is in contact (see FIG. 3A), the resilience against impact can be improved. In addition, disposing the plate contact regions 31b along the lengthwise direction of the substrate 23 makes it possible to reduce the amount by which the substrate 23 distorts in the lengthwise direction, which experiences a comparatively higher amount of distortion. It is therefore possible to prevent damage such as cracks from occurring in the portions of the substrate 23 that are anchored to the lower chassis 17 (the vicinity of the through-holes 23c).

However, in the case where the electronic component 25 is a component that emits a high amount of heat, such as, for example, a CPU (central processing unit), and the electronic component 25 is surrounded by plate members, there is the chance that the plate members will obstruct the flow of air to the space in which the electronic component 25 is disposed. Therefore, there are cases where the heat dissipation efficiency of the electronic component 25 is reduced. In this case, it is preferable to provide column-shaped contact members, as illustrated by the contact regions 31 in FIG. 3A.

In addition, the plate members may be configured so as to be in contact only with either the upper surface 23a or the lower surface 23b of the substrate 23. In other words, even if the configuration is such that the plate contact regions 31b are present on the upper surface 23a or the lower surface 23b of the substrate 23, and contact regions 31 are present on the lower surface 23b or the upper surface 23a, the same effect as the present embodiment can be achieved. That is, a configuration that employs both column members and plate members can be used in accordance with the shape and heat dissipation properties of the electronic components 25.

In addition, although the upper column member 26 and the lower column member 28 are described as making tight contact with the substrate 23 in the present embodiment, the configuration may have these members positioned opposite to the substrate 23 with an extremely small amount of space provided therebetween. That is, the same effect as the present embodiment can be achieved even if the configuration is such that the upper column member 26 and lower column member 28 are separated from the substrate 23 in a state where an impact is not applied to the electronic apparatus 1, and the upper column member 26 or lower column member 28 is in contact with the substrate 23 when an impact is applied to the electronic apparatus 1 and the substrate 23 distorts.

In addition, it is preferable for the configuration to be such that the surface of the electronic component 25 that is opposite to the surface that is mounted on the substrate 23 is opposite the upper primary wall 15 with the buffer member 29 disposed therebetween, as shown in FIG. 2. It is preferable for the buffer member 29 to be formed of a material that has a high thermal conductivity. For example, it is preferable for the buffer member 29 to be implemented by a graphite sheet. BGA-packaged semiconductor elements, capacitors, and the like are included as examples of the electronic component 25.

In addition, although the upper column member 26 and the lower column member 28 are described as having a cylindrical shape in the present embodiment, they may have a rectangular shape instead.

Finally, the substrate 23 of Embodiment 1 is an example of the substrate of the present invention, and the upper chassis 14 of Embodiment 1 is an example of the first support member of the present invention. The lower chassis 17 of Embodiment 1 is an example of the second support member of the present invention. The upper column member 26 of Embodiment 1 is an example of the first contact member of the present invention. The upper primary wall 15 of Embodiment 1 is an example of the first base body of the present invention. The lower column member 28 of Embodiment 1 is an example of the second contact member of the present invention. The lower primary wall 18 of Embodiment 1 is an example of the second base body of the present invention. The contact region 31 of Embodiment 1 is an example of the contact region of the present invention.

Embodiment 2

1. Configuration of Electronic Apparatus

Figure 4:
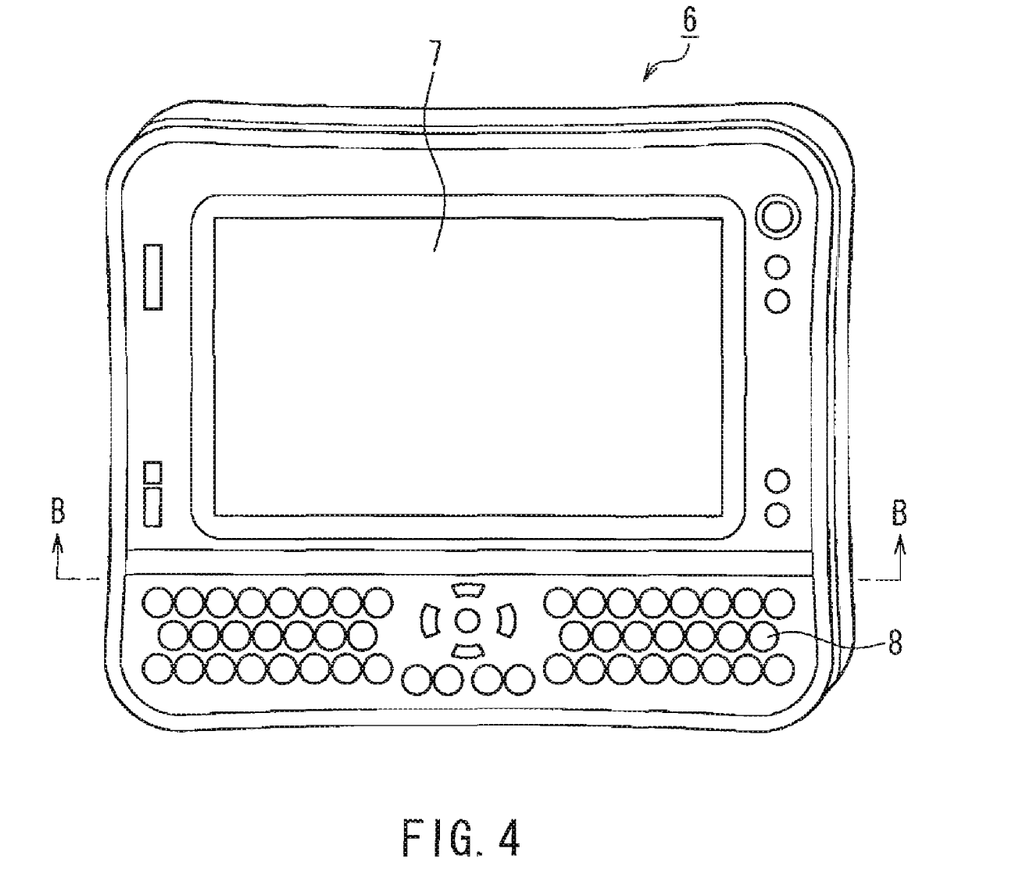
FIG. 4 is a perspective view of an electronic apparatus according to Embodiment 2 of the present invention.

FIG. 4 is a perspective view of an electronic apparatus according to Embodiment 2 of the present invention. An electronic apparatus 6 includes signal processing circuits and the like within a single housing. A display 7 and an operational unit 8 are disposed on the main surface of the housing of the electronic apparatus 6. The display 7 can be implemented by, for example, a liquid-crystal display. The operational unit 8 can be implemented using, for example, a keyboard. The electronic apparatus 6 is often operated while the user holds it with one or both hands, and thus is likely to be dropped on the floor or the like, and thus requires a higher resilience against impact. In the electronic apparatus 6, the side on which the display 7 and the operational unit 8 are disposed is defined as "top". Meanwhile, in the electronic apparatus 6, the side opposite to the side on which the display 7 and the operational unit 8 are disposed is defined as "bottom".

Figure 5:
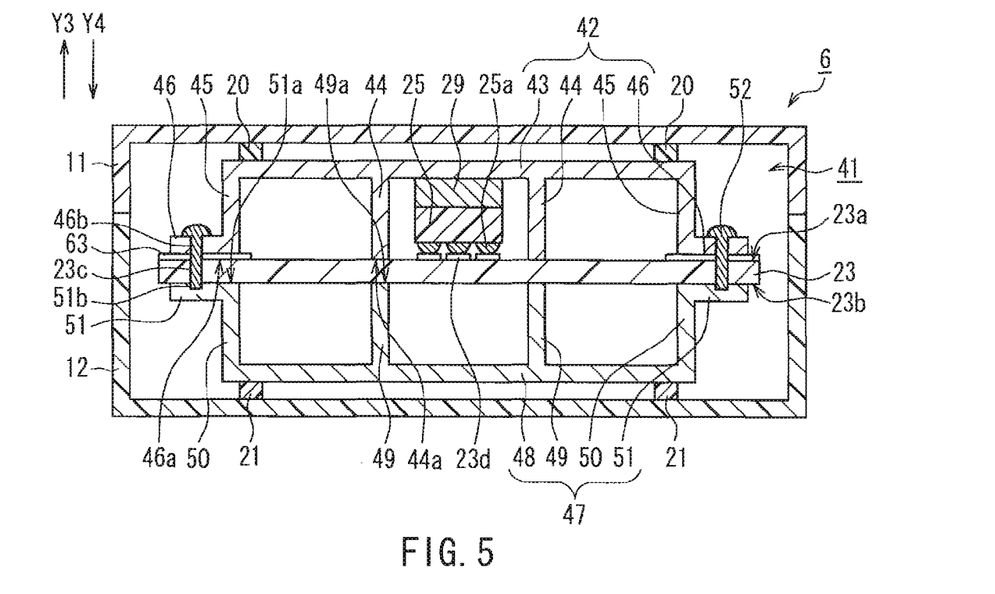
FIG. 5 is a cross-sectional view taken along the B-B line shown in FIG. 4.

FIG. 5 is a cross-sectional view taken along the B-B line of the electronic apparatus 6 according to Embodiment 2, as shown in FIG. 4. In the electronic apparatus 6 according to the present embodiment, constituent elements that are identical to those of the electronic apparatus 1 according to Embodiment 1 shall be given the same reference numerals, and descriptions thereof shall be omitted.

The electronic apparatus 6 is enclosed within an upper surface housing 11 and a lower surface housing 12. An electronic unit 41 is provided within the inner space formed by connecting the upper surface housing 11 and the lower surface housing 12. The electronic unit 41 is enclosed within an upper chassis 42 and a lower chassis 47. A substrate 23 is supported on the top and bottom by the upper chassis 42 and the lower chassis 47. Part of the substrate 23 is disposed within the space formed by the upper chassis 42 and the lower chassis 47.

The upper chassis 42, which may be considered a first support member, is formed of a magnesium alloy. The upper chassis 42 includes an upper primary wall 43, upper column portions 44, upper side walls 45, and side wall end portions 46. The upper primary wall 43, upper column portions 44, upper side walls 45, and side wall end portions 46 are formed as a single body. The upper primary wall 43 is in contact with and is anchored to the inner surface of the upper surface housing 11 (the surface opposite to the lower surface housing 12) with buffer members 20 therebetween. The buffer members 20 may be formed of an elastic material such as rubber.

The lower chassis 47, which may be considered a second support member, also is formed of a magnesium alloy. The lower chassis 42 has a lower primary wall 48, lower column portions 49, lower side walls 50, and side wall end portions 51. The lower primary wall 48, lower column portions 49, lower side walls 50, and side wall end portions 51 are formed as a single body. The lower primary wall 48 is in contact with and is anchored to the inner surface of the lower surface housing 12 (the surface opposite to the upper surface housing 11) with buffer members 21 therebetween. The buffer members 21 also may be formed of an elastic material such as rubber.

End portions 44a of the upper column portions 44, which may be considered first contact members, may be in contact with the upper surface 23a of the substrate 23, or may be opposite the upper surface 23a of the substrate 23 with an extremely small amount of space provided therebetween. Meanwhile, end portions 49a of the lower column portions 49, which may be considered second contact members, may be in contact with the lower surface 23b of the substrate 23, or may be opposite the lower surface 23b of the substrate 23 with an extremely small amount of space provided therebetween.

Although the end portions 44a of the upper column portions 44 and the upper surface 23a of the substrate 23 may be in tight contact or are opposite each other with an extremely small amount of space provided therebetween, it should be noted that the present embodiment describes an example in which the two are in tight contact. Likewise, although the end portions 49b of the lower column portions 49 and the lower surface 23b of the substrate 23 may be in tight contact or are opposite each other with an extremely small amount of space provided therebetween, it should be noted that the present embodiment describes an example in which the two are in tight contact. In the following descriptions, the term "contact" is intended to be taken as meaning "tight contact" unless otherwise specified. Note that an "extremely small amount of space" refers to a distance less than or equal to the amplitude of the distortion that is transmitted to the substrate 23 caused by the electronic unit 41 receiving a disturbance. This amplitude can be evaluated based on, for example, the surface area of the substrate 23, the mounting state of electronic component 25 with respect to the substrate 23 (that is, the mounting density, size, mass, and so on of the electronic components 25), the positioning in the substrate 23 of the screws 24 that anchor the substrate 23 to the lower chassis 17, and so on. The distance of this extremely small amount of space therefore cannot be specified.

At least part of the areas on the lower surface 23b that correspond to the regions at which the end portions 44a are in contact with the upper surface 23a overlap with the regions at which the end portions 49a are in contact with the lower surface 23b. In other words, the substrate 23 is supported both on the top and bottom by the upper column portions 44 and the lower column portions 49, respectively.

The side wall end portions 46 are formed in the end portions of the upper side walls 45 so as to be approximately perpendicular to the upper side walls 45. End surfaces 46a of the side wall end portions 46 is in contact with the upper surface 23a of the substrate 23. Through-holes 46b are formed in the side wall end portions 46.

The side wall end portions 51 are formed in the end portions of the lower side walls 50 so as to be approximately perpendicular to the lower side walls 50. End surfaces 51a of the side wall end portions 51 are in contact with the lower surface 23b of the substrate 23. Screw holes 51b are formed in each side wall end portion 51.

Through-holes 23c are formed in the portions of the substrate 23 that are sandwiched between the side wall end portions 46 and the side wall end portions 51. The substrate 23 is held between the upper side wall 45 and the lower side wall 50 by passing screws 52 through the through-holes 46b and the through-holes 23c and threading them into the screw holes 51b.

Figure 6A:
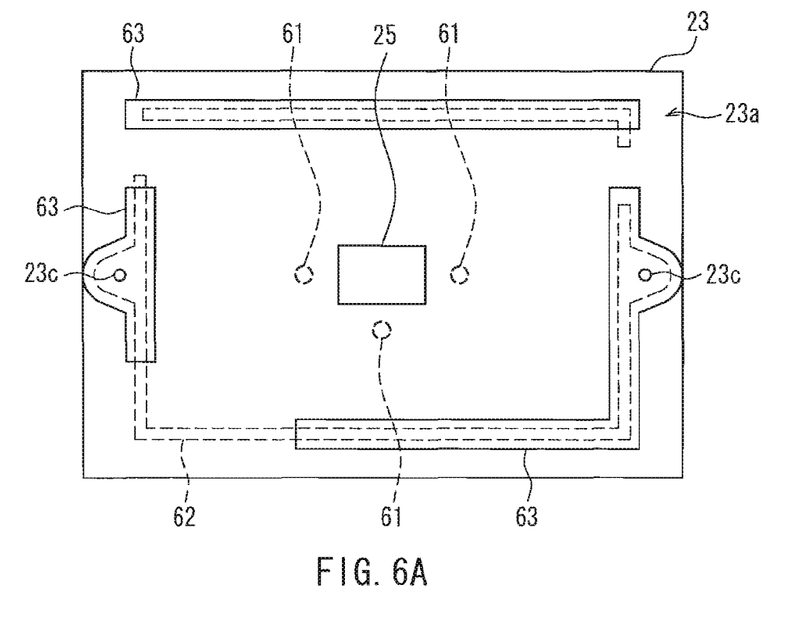
FIG. 6A is a plan view of a substrate.

FIG. 6A is a plan view of the upper surface 23a of the substrate 23 according to Embodiment 2. As shown in FIG. 6A, contact regions 61 are present around or in the vicinity of an electronic component 25. The contact regions 61 are regions in the upper surface 23a where the upper column portions 44 (see FIG. 5) is in contact. It is preferable for the contact regions 61 to be present in the regions of the substrate 23 that distort the most when an impact is applied to the electronic apparatus 6. For example, in the case where the vicinity of the external edge of the substrate 23 is anchored and supported by screws and/or in the case where electronic components 25 are mounted almost uniformly across the entire surface of the substrate 23, the vicinity of the center of the substrate 23 distorts the most. Positioning the contact regions 61 in the vicinity of the center of the substrate 23 therefore makes it possible to reduce distortion of the substrate 23. It is thus possible to prevent cracks from forming in the substrate 23 in the vicinity of the through-holes 23c.

In the substrate 23 shown in FIG. 6A, the electronic component 25 is disposed in the vicinity of the center of the substrate 23, and thus it is preferable for the contact regions 61 to be surrounding or in the vicinity of the electronic component 25. Positioning the contact regions 61 surrounding or in the vicinity of the electronic component 25 makes it possible to prevent the soldered portions of the electronic components 25 from separating due to distortion of the substrate 23.

Note that a configuration in which the upper column portions 44 are in contact with the top of an electronic component 25 mounted on the substrate 23 can also prevent the soldered portions of the electronic component 25 that the upper column portions 44 are in contact with from separating. However, distortion in the substrate 23 is transmitted directly to the electronic component 25. There is a high likelihood that the electronic component 25 will be damaged, and thus the configuration in which the electronic component 25 is in contact with the upper column portions 44 offers no practical advantages.

Furthermore, side wall contact regions 62 are present in the vicinity of the edges of the upper surface 23a of the substrate 23. The side wall contact regions 62 are regions in the upper surface 23a where the upper side walls 45 (see FIG. 5) are in contact.

It is preferable to dispose grounding metallic portions 63 on the substrate 23 so as to overlap with at least part of the side wall contact regions 62. The grounding metallic portions 63 can be formed of, for example, layered copper. The grounding metallic portions 63 are grounding patterns that set the 0 level of voltage for the substrate 23. Although the grounding metallic portions 63 are formed of copper in the present embodiment, it should be noted that these portions may be formed of any conductive material.

Bringing the upper side walls 45 into contact with the grounding metallic portions 63 enables the upper chassis 42 to be used as a grounding metal in the same manner as the grounding metallic portions 63. For this reason, the grounding capacity can be increased and EMI (electromagnetic interference) can be reduced or eliminated, as compared to the case where only the grounding metallic portions 63 are used as the grounding metal. EMI also can be reduced or eliminated by disposing grounding metal on the lower surface 23b of the substrate 23 and bringing the grounding metal and the lower side walls 50 into contact with each other.

2. Behavior When Impact is Applied to Electronic Apparatus

Next, states occurring when an impact, such as an impact resulting from being dropped, is applied to the electronic apparatus 6 having the abovementioned configuration shall be described with reference to FIG. 5.

When a user accidentally drops the electronic apparatus 6 onto the floor or the like, a large impact is applied to the electronic apparatus 6 when the electronic apparatus 6 collides with the floor or the like. For example, when an impact is applied to the lower surface housing 12 (see FIG. 5), that impact is transmitted to the electronic unit 41 via the buffer members 21. Because the buffer members 21 are formed of elastic bodies, the impact transmitted from the lower surface housing 12 can be softened. Meanwhile, in the case where an impact is applied to the upper surface housing 11, that impact is softened by the buffer members 20 before being transmitted to the electronic unit 41.

The impact that is transmitted to the electronic unit 41 attempts to reach the substrate 23 via the upper column portions 44 or the lower column portions 49.

Here, because the upper column portions 44 and the lower column portions 49 are formed in a column shape, the durability with respect to the directions indicated by the arrows Y3 and Y4 in FIG. 5 is high. For this reason, even if an impact is transmitted from the upper surface housing 11 and the lower surface housing 12, the upper column portions 44 and the lower column portions 49 experience very little distortion in the directions indicated by the arrows Y3 and Y4. Thus, even if the electronic apparatus 6 is accidentally dropped onto a floor or the like, the substrate 23 is supported on the top and bottom by the upper column portions 44 and the lower column portions 49, and thus the regions that are supported by the upper column portions 44 and the lower column portions 49 experience little distortion. In addition, because the region of the substrate 23 that experiences the most distortion is supported by the upper column portions 44 and the lower column portions 49, the substrate experiences little distortion as a whole. Furthermore, sandwiching the substrate 23 between the upper side walls 45 and the lower side walls 50 makes it possible further to reduce distortion occurring in the substrate 23 when the electronic apparatus 6 accidentally is dropped on the floor or the like.

3. Effects of the Embodiment, etc.

According to the present embodiment, the substrate 23 can be prevented from being damaged when an impact is applied to the electronic apparatus 6. In other words, with a configuration such as that shown in FIG. 7, in which the region of the substrate 102 that distorts the most (for example, the vicinity of the center) is not supported, the substrate 102 distorts extensively when an impact is applied to the electronic apparatus 101. If the substrate 102 distorts extensively, there is a heightened chance for damage such as cracking to occur in the vicinity of the portions that are anchored by the screws 107. As opposed to this, in the configuration of the present embodiment, the regions of the substrate 23 that experience the most distortion are supported by the upper column portions 44 and the lower column portions 49, making it possible to reduce the amount by which the substrate 23 distorts when an impact is applied to the electronic apparatus 6. It is therefore possible to prevent damage such as cracks from occurring in the portions of the substrate 23 that are anchored by the screws 52 to the upper chassis 42 and the lower chassis 47 (the vicinity of the through-holes 23c).

Note that the "regions that distort the most" in the substrate 23 generally indicates the regions that are the furthest (in FIG. 6A, a line central and perpendicular to a line spanning between the two through-holes 23c) from the portions of the substrate 23 that are anchored (in FIG. 6A, the through-holes 23c). However, as mentioned earlier, the "regions that distort the most" change depending on the state in which the electronic components 25 are mounted on the substrate 23 or the like. Practically speaking, the "region that distorts the most" is in the vicinity of the center of the substrate 23.

Furthermore, according to the present embodiment, as shown in FIG. 6A, disposing the electronic component 25 in the vicinity of the contact regions 61 is it possible to prevent the terminals 25a of the electronic component 25 from separating from the wiring pattern 23d (see FIG. 5), thereby preventing the electrical connection therebetween from being severed. This effect is particularly evident in BGA-packaged electronic components, whose adhesion to the substrate 23 is relatively weak.

In addition, because the upper column portions 44 and the upper primary wall 43 are formed as a single body, the upper column portions 44 and the upper primary wall 43 can be manufactured at the same time, making it possible to reduce the number of manufacturing steps. Likewise, because the lower column portions 49 and the lower primary wall 48 are formed as a single body, the lower column portions 49 and the lower primary wall 48 can be manufactured at the same time, making it possible to reduce the number of manufacturing steps.

Figure 6B:
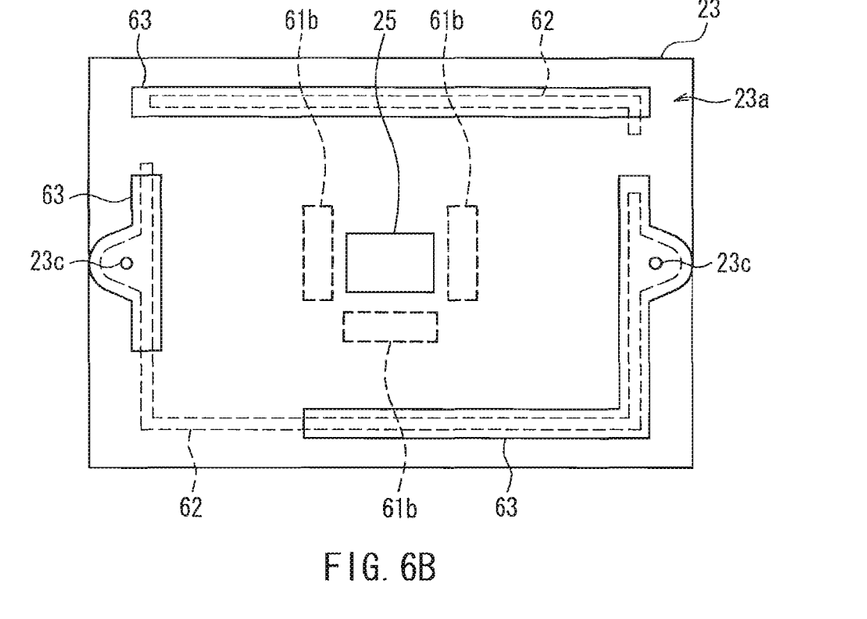
FIG. 6B is a plan view illustrating another configuration of a substrate.

Although the shape of the contact members that support the substrate 23 (the upper column portions 44 and lower column portions 49) are described as being columns in the present embodiment, it should be noted that the contact members may be plate-shaped instead. FIG. 6B is a plan view illustrating a substrate 23 provided with plate-shaped contact members (called "plate members" hereinafter). As shown in FIG. 6B, plate contact regions 61b, with which the plate members is in contact, are present in the substrate 25 in the vicinity of the electronic component 25, or regions where the substrate 23 distorts the most when an impact is applied to the electronic apparatus 6. Because the plate contact regions 61b have an area that is larger than that of the contact regions 61 with which the column members is in contact, the resilience against impact can be improved. In addition, disposing the plate contact regions 61b along the lengthwise direction of the substrate 23 makes it possible to reduce the amount by which the substrate 23 distorts in the lengthwise direction, which experiences a comparatively higher amount of distortion. It is therefore possible to prevent damage such as cracks from occurring in the portions of the substrate 23 that are anchored by the screws 52 to the upper chassis 42 and the lower chassis 47 (the vicinity of the through-holes 23c).

Figure 6C:
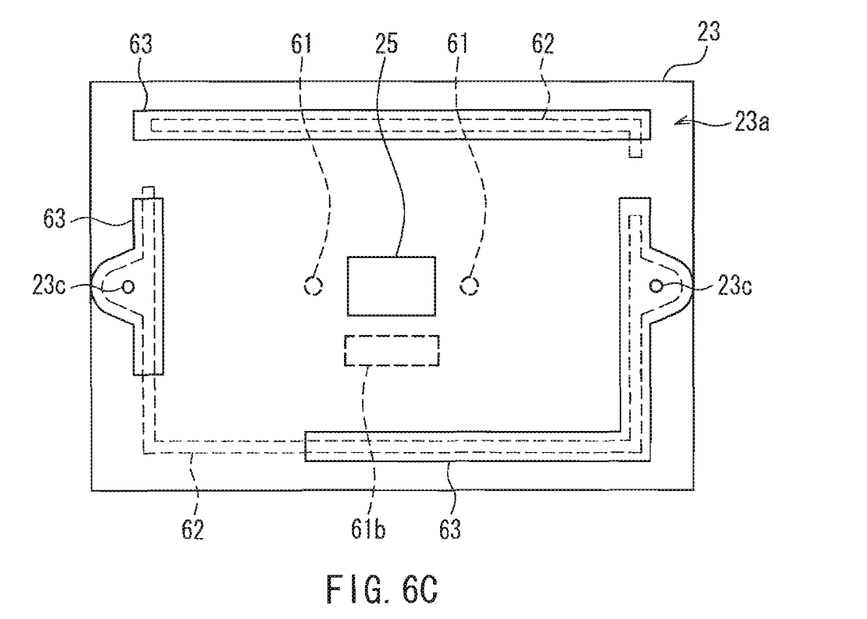
FIG. 6C is a plan view illustrating another configuration of a substrate.

However, in the case where the electronic component 25 is a component that emits a high amount of heat, such as, for example, a CPU (central processing unit), and the electronic component 25 is surrounded by plate members, there is the chance that the plate members will obstruct the flow of air to the space in which the electronic component 25 is disposed. Therefore, there are cases where the heat dissipation efficiency of the electronic component 25 is reduced. In this case, a configuration that combines column members with plate members, such as the contact regions 61 and plate contact regions 61b shown in FIG. 6C, is preferable.

In addition, the plate members may be configured so as to is in contact only with either the upper surface 23a or the lower surface 23b of the substrate 23. In other words, even if the configuration is such that the plate contact regions 61b are present on the upper surface 23a or the lower surface 23b of the substrate 23, and contact regions 61 are present on the lower surface 23b or the upper surface 23a, the same effects as the present embodiment can be achieved. That is, a configuration that employs both column members and plate members can be used in accordance with the shape and heat dissipation properties of the electronic components 25.

In addition, although the upper column portions 44 and the lower column portions 49 are described as making tight contact with the substrate 23 in the present embodiment, the configuration may have these portions positioned opposite to the substrate 23 with an extremely small amount of space provided therebetween. That is, the same effects as the present embodiment can be achieved even if the configuration is such that the upper column portions 44 and lower column portions 49 are separated from the substrate 23 in a state where an impact is not applied to the electronic apparatus 1, and the upper column portions 44 or lower column portions 49 is in contact with the substrate 23 when an impact is applied to the electronic apparatus 1 and the substrate 23 distorts.

In addition, although the upper column portions 44 and the lower column portions 49 are described as having a cylindrical shape in the present embodiment, they may have a rectangular shape instead.

Note that Embodiment 1 illustrated an example in which the upper chassis 14 and the lower chassis 17 are formed of a magnesium alloy. Embodiment 2 also illustrates an example in which the upper chassis 42 and the lower chassis 47 are formed of a magnesium alloy. Magnesium alloy is preferable due to its light weight and high durability. However, the upper chassis 14 and 42 and the lower chassis 17 and 47 may be formed of another metal material.

In addition, it is not completely necessary to provide the buffer member 29. However, because the buffer member 29 can transfer heat generated by the electronic component 25 to the upper primary wall 15, thereby improving the heat dissipation properties, it is preferable to provide the buffer member 29 between the electronic component 25 and the upper primary wall 15. In addition, because the buffer member 29 can absorb impacts transmitted from the upper primary wall 15 to the electronic component 25, thereby improving the resilience against impact, it is preferable to provide the buffer member 29 between the electronic component 25 and the upper primary wall 15.

Finally, the substrate 23 of Embodiment 2 is an example of the substrate of the present invention, and the upper chassis 42 of Embodiment 2 is an example of the first support member of the present invention. The lower chassis 47 of Embodiment 2 is an example of the second support member of the present invention. The upper column portions 44 of Embodiment 2 are examples of the first contact member of the present invention. The upper primary wall 43 of Embodiment 2 is an example of the first base body of the present invention. The lower column portions 49 of Embodiment 2 are examples of the second contact member of the present invention. The lower primary wall 48 of Embodiment 2 is an example of the second base body of the present invention. The contact regions 61 and 61b of Embodiment 2 are examples of the contact region of the present invention.

The electronic unit and electronic apparatus of the present invention are useful in various electronic units and electronic apparatuses, such as personal computers.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic unit comprising:
   a substrate including a first main surface and a second main surface opposite to the first main surface, on which an electronic component is mounted, and
   a support member that supports the substrate,
   wherein the support member includes a first support member and a second support member, with the substrate being sandwiched between the support members;
   the first support member has first side walls disposed on both ends,
   the first side walls each have a first side wall end portion,
   the first side wall end portions are formed substantially perpendicular to the first side walls, an end surface of each first side wall end portion comes into contact with the first main surface of the substrate,
   the second support member has second side walls disposed on both ends,
   the second side walls each have a second side wall end portion,
   the second side wall end portions are formed substantially perpendicular to the second side walls, an end surface of each second side wall end portion comes into contact with the second main surface of the substrate,
   the first side wall end portions, the substrate, and the second side wall end portions are fastened together,
   the first support member has a first contact member between the first side walls, and an end portion of the first contact member comes into contact with the first main surface of the substrate,
   the second support member has a second contact member between the second side walls, and an end portion of the second contact member comes into contact with the second main surface of the substrate,
   at least part of the area at which the first contact member is in contact with the substrate overlaps with a region at which the second contact member is in contact with the substrate, and
   the first support member and the second support member are configured substantially to reduce distortion of the substrate in a direction perpendicular to the first main surface and the second main surface.

2. The electronic unit according to claim 1, wherein the first contact member and at least one of the first side walls are formed as a single body.

3. The electronic unit according to claim 1, wherein the second contact member and at least one of the second side walls are formed as a single body.

4. The electronic unit according to claim 1, wherein the first contact member and the second contact member are capable of being in contact with the substrate at the region that experiences the largest amount of distortion.

5. The electronic unit according to claim 1, wherein the center line of the first contact member and the center line of the second contact member are matched, and the center lines are center on the surface of the contact members that is in contact with the substrate.

6. The electronic unit according to claim 1, wherein the first contact member and the second contact member are capable of being in contact with the substrate in the vicinity of the electronic component.

7. An electronic apparatus comprising:
   a housing,
   an electronic unit that includes a substrate and a support member, the substrate having a first main surface on which an electronic component is mounted and a second main surface opposite to the first main surface, the support member that supports the substrate, the electronic unit being contained in the housing,
   wherein the support member includes a first support member and a second support member, with the substrate being sandwiched between the support members;
   the first support member has first side walls disposed on both ends,
   the first side walls each have a first side wall end portion,
   the first side wall end portions are formed substantially perpendicular to the first side walls, an end surface of each first side wall end portion comes into contact with the first main surface of the substrate,
   the second support member has second side walls disposed on both ends,
   the second side walls each have a second side wall end portion, the second wall end portions are formed substantially perpendicular to the second side walls, an end surface of each second side wall end portion comes into contact with the second main surface of the substrate, the first side wall end portions, the substrate, and the second side wall end portions are fastened together, the first support member has a first contact member between the first side walls, and an end portion of the first contact member comes into contact with the first main surface of the substrate, at least part of the area at which the first contact member is in contact with the substrate overlaps with a region at which the second contact member is in contact with the substrate, and the first support member and the second support member are configured substantially to reduce distortion of the substrate in a direction perpendicular to the first main surface and the second main surface.

* * * * *